(12) United States Patent
Wang et al.

(10) Patent No.: US 10,438,881 B2
(45) Date of Patent: Oct. 8, 2019

(54) PACKAGING ARRANGEMENTS INCLUDING HIGH DENSITY INTERCONNECT BRIDGE

(71) Applicant: Marvell World Trade Ltd., St. Michael (BB)

(72) Inventors: Long-Ching Wang, Cupertino, CA (US); Lijuan Zhang, Fremont, CA (US); Ronen Sinai, Yokneam (IL)

(73) Assignee: Marvell World Trade Ltd., St. Michael (BB)

( * ) Notice: Subject to any disclaimer, the term of this patent is extended or adjusted under 35 U.S.C. 154(b) by 13 days.

(21) Appl. No.: 15/334,188

(22) Filed: Oct. 25, 2016

(65) Prior Publication Data

US 2017/0125334 A1    May 4, 2017

Related U.S. Application Data

(60) Provisional application No. 62/290,722, filed on Feb. 3, 2016, provisional application No. 62/247,864, filed on Oct. 29, 2015.

(51) Int. Cl.
| | |
|---|---|
| *H01L 23/34* | (2006.01) |
| *H01L 23/498* | (2006.01) |
| *H01L 23/00* | (2006.01) |
| *H01L 25/065* | (2006.01) |
| *H01L 21/48* | (2006.01) |

(Continued)

(52) U.S. Cl.
CPC .... *H01L 23/49838* (2013.01); *H01L 21/4853* (2013.01); *H01L 21/4857* (2013.01); *H01L 21/565* (2013.01); *H01L 23/3114* (2013.01); *H01L 23/49822* (2013.01); *H01L 23/5383* (2013.01); *H01L 24/16* (2013.01); *H01L 25/0655* (2013.01); *H01L 25/50* (2013.01); *H01L 23/538* (2013.01); *H01L 2224/1623* (2013.01)

(58) Field of Classification Search
CPC ............. H01L 21/4853; H01L 21/4857; H01L 25/0655; H01L 25/0657; H01L 25/50; H01L 23/49838; H01L 23/49844; H01L 23/49822; H01L 23/3114; H01L 23/4821; H01L 23/5381; H01L 23/5221; H01L 24/16; H01L 24/17; H01L 2224/32145; H01L 24/97; H01L 24/24; H01L 24/32; H01L 24/83
USPC ........ 438/108, 107, 109, 110; 257/776, 777, 257/778, 686, 723, 724
See application file for complete search history.

(56) References Cited

U.S. PATENT DOCUMENTS

| | | | |
|---|---|---|---|
| 7,649,245 B2 * | 1/2010 | Zingher | .................. H01L 23/48 257/664 |
| 9,147,663 B2 * | 9/2015 | Liu | .......................... H01L 24/33 |

(Continued)

*Primary Examiner* — S. V. Clark

(57) ABSTRACT

Embodiments provide a packaging arrangement that includes a high density interconnect bridge for interconnecting dies within the packaging arrangement. The packaging arrangement comprises one or more redistribution layers and an interconnect bridge embedded within the one or more redistribution layers. A first die is coupled to (i) a first portion of the one or more redistribution layers and (ii) a first portion of the interconnect bridge. A second die coupled to a (ii) a second portion of the one or more redistribution layers and (ii) a second portion of the interconnect bridge to electrically couple the first die and the second die via at least the first interconnect bridge.

20 Claims, 3 Drawing Sheets

(51) Int. Cl.
*H01L 21/56* (2006.01)
*H01L 23/31* (2006.01)
*H01L 25/00* (2006.01)
*H01L 23/538* (2006.01)

(56) References Cited

U.S. PATENT DOCUMENTS

| | | | | |
|---|---|---|---|---|
| 9,368,450 | B1* | 6/2016 | Gu | H01L 23/5385 |
| 9,379,090 | B1* | 6/2016 | Syed | H01L 25/0655 |
| 9,418,966 | B1* | 8/2016 | Kwon | H01L 23/488 |
| 9,508,636 | B2* | 11/2016 | Zhang | H01L 24/16 |
| 9,542,522 | B2* | 1/2017 | Qian | G06F 17/5077 |
| 2010/0327424 | A1* | 12/2010 | Braunisch | H01L 23/13 257/692 |
| 2013/0256000 | A1* | 10/2013 | Terui | H05K 1/0298 174/251 |
| 2014/0117552 | A1* | 5/2014 | Qian | H01L 23/49827 257/762 |
| 2014/0131854 | A1* | 5/2014 | Hawk | H01L 23/5385 257/737 |
| 2014/0159228 | A1* | 6/2014 | Teh | H01L 24/19 257/734 |
| 2014/0252646 | A1 | 9/2014 | Hung et al. | |
| 2014/0264337 | A1* | 9/2014 | Chen | H01L 25/0652 257/48 |
| 2014/0360759 | A1 | 12/2014 | Kunieda et al. | |
| 2015/0084210 | A1 | 3/2015 | Chiu et al. | |
| 2015/0235991 | A1 | 8/2015 | Gu et al. | |
| 2016/0071818 | A1* | 3/2016 | Wang | H01L 25/0655 257/774 |
| 2016/0079196 | A1* | 3/2016 | Teh | H01L 23/3114 257/774 |
| 2016/0141234 | A1* | 5/2016 | We | H01L 23/5385 361/767 |
| 2018/0102311 | A1* | 4/2018 | Shih | H01L 23/49838 |
| 2018/0182699 | A1* | 6/2018 | Lai | H01L 23/5223 |
| 2019/0027431 | A1* | 1/2019 | Feng | H01L 23/49838 |

* cited by examiner

PACKAGING ARRANGEMENTS INCLUDING HIGH DENSITY INTERCONNECT BRIDGE

CROSS REFERENCE TO RELATED APPLICATIONS

This claims priority to U.S. Provisional Patent Application No. 62/290,722, filed on Feb. 3, 2016 and U.S. Provisional Patent Application No. 62/247,864, filed on Oct. 29, 2015, which are incorporated herein by reference in their entireties.

TECHNICAL FIELD

Embodiments of the present disclosure relate to semiconductor packaging arrangements, and in particular to a packaging arrangement that includes a high density interconnect bridge for interconnecting dies within the packaging arrangement.

BACKGROUND

Packaging arrangements for semiconductor devices often include numerous semiconductor devices within the package. Some of the semiconductor devices may need high density interconnects with respect to other semiconductor devices and components within the package. However, materials for creating and providing such high density interconnects can be expensive and/or complicated.

SUMMARY

In various embodiments, the present disclosure provides a packaging arrangement comprising one or more redistribution layers and an interconnect bridge embedded within the one or more redistribution layers. A first die is coupled to (i) a first portion of the one or more redistribution layers and (ii) a first portion of the interconnect bridge. A second die coupled to a (ii) a second portion of the one or more redistribution layers and (ii) a second portion of the interconnect bridge to electrically couple the first die and the second die via at least the first interconnect bridge.

In various embodiments, the present disclosure also provides a method that comprises providing a carrier and coupling an interconnect bridge to the carrier. One or more redistribution layers are formed on the carrier around the interconnect bridge and copper posts are formed on the interconnect bridge and the one or more redistribution layers. A first die is coupled to a first set of copper posts on the interconnect bridge and a first set of copper posts on the one or more redistribution layers. A second die is coupled to a second set of copper posts on the interconnect bridge and a second set of copper posts on the one or more redistribution layers. The carrier is removed.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

DETAILED DESCRIPTION

Figure 1A:
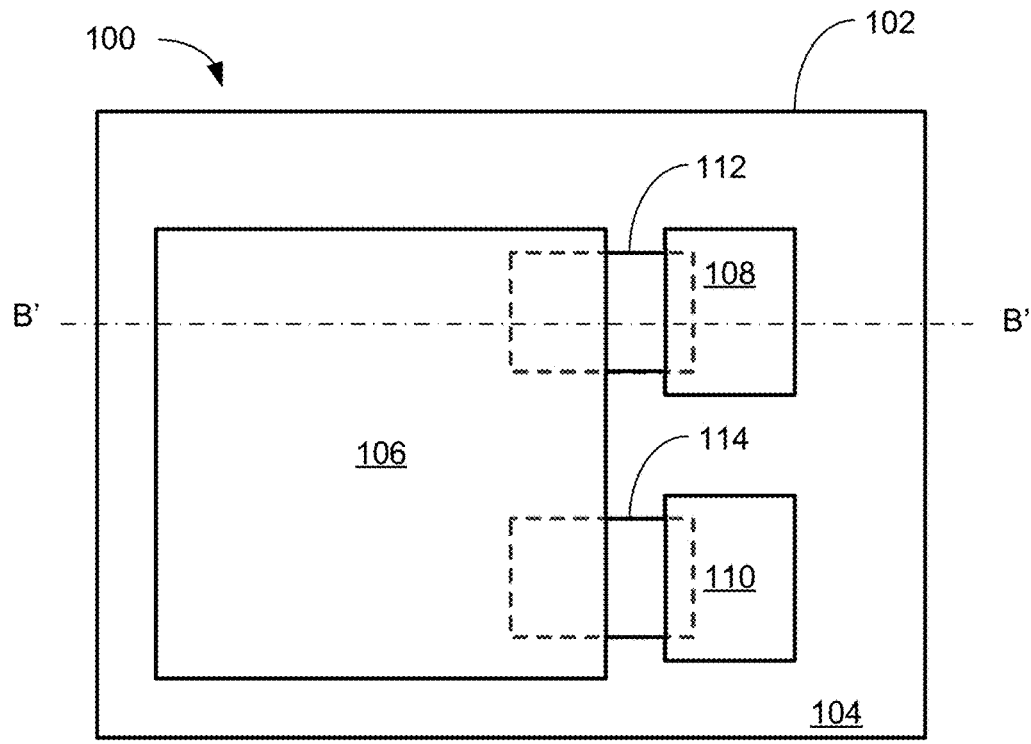
FIG. 1A schematically illustrates a top view of a stage of a packaging arrangement including high density interconnect bridges, in accordance with embodiments.

FIG. 1A schematically illustrates a top view of a stage of packaging arrangement 100 that includes a carrier 102 and one or more redistribution layers 104 on a top surface of the carrier 102. As will be discussed further herein, the carrier 102 will eventually be removed from the packaging arrangement 100. A first die 106, a second die 108 and a third die 110 are arranged on the carrier 102. The first die 106 is electrically or communicatively coupled to the second die 108 via a first interconnect bridge 112. The first die 106 is also electrically or communicatively coupled to the third die 110 via a second interconnect bridge 114. The first die 106, the second die 108 and the third die 110 are generally semiconductor devices that are generally configured to provide, for example, processors, processing cores, various types of memory, system-on-chip (SOC), etc.

The first interconnect bridge 112 is generally configured to provide high density interconnection between the first die 106 and the second die 108. The second interconnect bridge 114 is generally configured to provide high density interconnection between the first die 106 and the third die 110. For example, the interconnect bridges 112, 114 may be configured to allow for interconnects having a size of two micrometers or less and spacing between the various interconnects of two micrometers or less. In embodiments, the interconnect bridges comprise silicon.

Figure 1B:
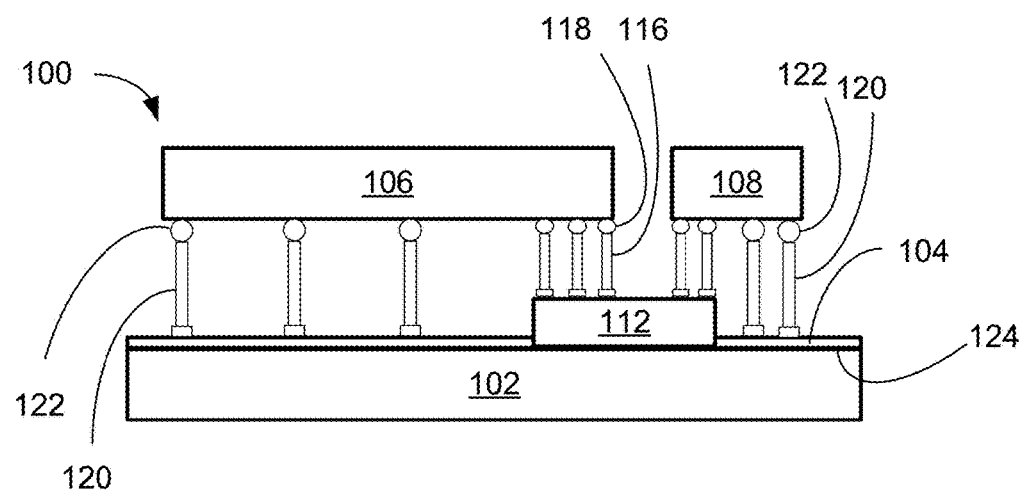
FIG. 1B schematically illustrates a cross-sectional view of the packaging arrangement of FIG. 1A as seen along the line B'-B', in accordance with embodiments.

FIG. 1B is a cross-sectional view of the packaging arrangement 100 of FIG. 1A as seen along the line B'-B'. As can be seen, the first die 106 and the second die 108 are coupled to the first interconnect bridge 112 via first copper columns or posts 116. Microbumps 118, generally in the form of copper bumps, may be included on the first die 106 and the second die 108 to allow for flip chip attachment of the first die 106 and the second die 108 onto the first copper posts 116. Additionally, second copper columns or posts 120 are provided to electrically or communicatively couple the first die 106 and the second die 108 to the one or more redistribution layers 104. Once again, microbumps 122, generally in the form of copper bumps, may be provided on the first die 106 and the second die 108 to allow for flip chip attachment of the first die 106 and the second die 108 onto the second copper posts 120 at the same time as the first die and second die are flip chip attached to the first copper posts 116. Alternatively, the microbumps 118 and the microbumps 122 may be placed on the first copper posts 116 and the second copper posts 120, respectively, for the flip chip attachment of the first die 106 and the second die 108 if desired. In embodiments, the copper posts 120 generally allow for a density of interconnection of more than two micrometers. Thus, the copper posts 120 are generally more than two micrometers in size and are spaced from one another more than two micrometers.

While not illustrated in FIG. 1B, the first die 106 and the third die 110 are coupled to copper posts (similar to copper posts 116 and microbumps 118) that couple the first die 106 to the second interconnect bridge 114. Also, the third die 110 is also attached to copper posts (similar to the copper posts 120 and microbumps 122) that couple the third die 110 to the one or more redistribution layers 104. Thus, the first die 106 is electrically or communicatively coupled to the second die 108 via the first interconnect bridge 112 and the first die 106 is electrically or communicatively coupled to the third die 110 via the second interconnect bridge 114. Additionally, the first die 106, the second die 108 and the third die 110 are electrically or communicatively coupled to each other via the one or more redistribution layers 104. By utilizing a high density interconnect bridge for only those interconnects that require high density interconnects, less high density silicon is required for the high density interconnects and, thus cost and complexity can be saved by utilizing the interconnect bridges 112, 114.

Figure 2:
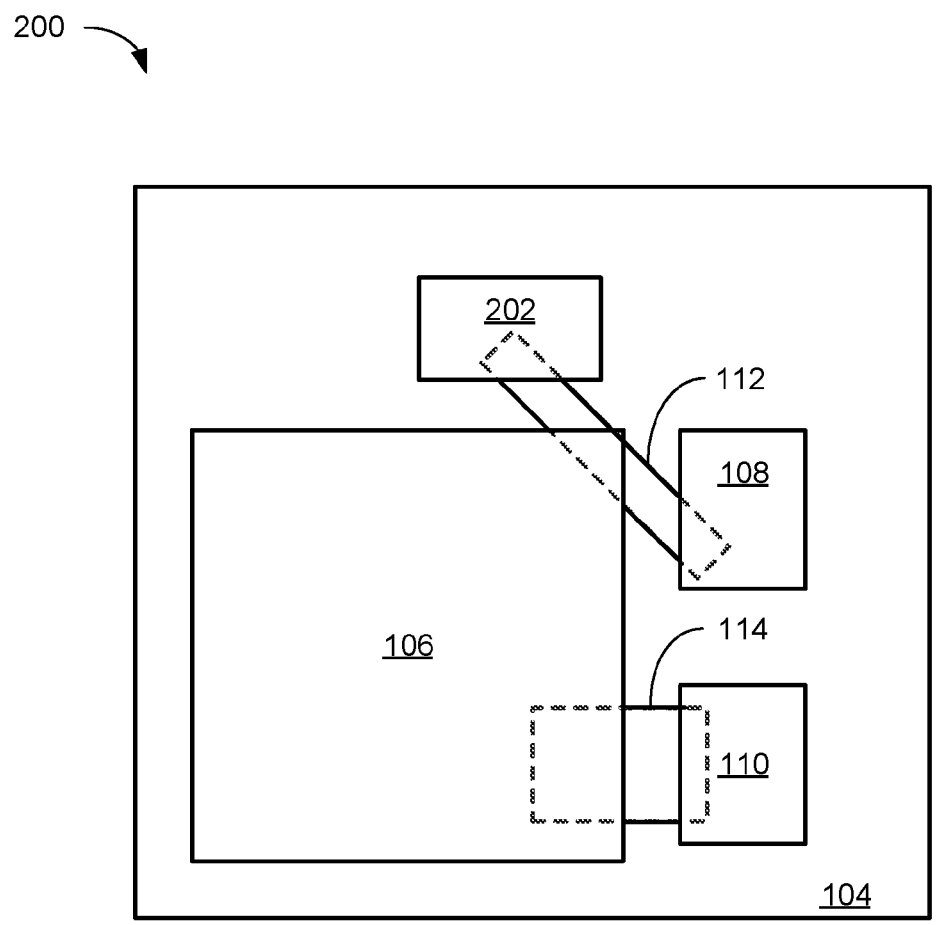
FIG. 2 schematically illustrates a top view of another packaging arrangement including high density interconnect bridges, in accordance with embodiments.

As can be seen in FIG. 1A, the interconnect bridges 112, 114 are substantially parallel to edges of the one or more redistribution layers 104 and/or edges of the dies 106, 108 and/or 110. FIG. 2 schematically illustrates a packaging arrangement 200 where the first interconnect bridge 112 is not parallel with respect to the edges of the one or more redistribution layers 104 and/or edges of the dies 106, 108 and/or 110, but rather is diagonally positioned. This allows the first interconnect bridge 112 to be used to electrically or communicatively couple the first die 106, the second die 108 and a fourth die 202. The coupling is generally achieved as previously described using copper posts and microbumps. In embodiments, one or both of the interconnect bridges 112, 114 can be substantially parallel with respect to one or more edges of the one or more redistribution layers 104 and/or edges of the dies 106, 108 and/or 110. Also, in embodiments, neither of the interconnect bridges 112, 114 are substantially parallel with respect to one or more edges of the one or more redistribution layers 104 and/or edges of the dies 106, 108 and/or 110. Also, more or less dies 106, 108, 110 and more or less interconnect bridges 112, 114 may be included with the packaging arrangement 100 if desired, with some, none or all of the interconnect bridges being substantially parallel with respect to one or more edges of the one or more redistribution layers 104 and/or edges of the dies. In embodiments, the interconnect bridges may also be used to electrically or communicatively couple more than two dies if desired.

In order to make or manufacture the package arrangements 100 and 200, the carrier 102 is provided. The carrier 102 includes a die attach tape or film. The first interconnect bridge 112 is placed on the carrier 102 along with the second interconnect bridge 114. One or more redistribution layers 104 are then formed/grown on the carrier 102 around the first interconnect bridge 112 and the second interconnect bridge 114. Thus, the interconnect bridges 112, 114 are embedded within the one or more redistribution layers 104. In embodiments, the one or more redistribution layers 104 are formed using a backend polymer/plating process with copper metal line width/spacing of two micrometers/two micrometers or more. Thus, generally, in embodiments, the line width and spacing of the interconnect spacing, e.g. spacing of the copper posts 116, is less than copper metal line width/spacing of the one or more redistribution layers 104. In embodiments, the redistribution layers 104 may be grown prior to placement of the first interconnect bridge 112 and the second interconnect bridge 114 on the carrier 102 and thus, the first interconnect bridge 112 and the second interconnect bridge 114 would be placed on the redistribution layers 104.

In embodiments, sides or edges of the redistribution layers 104 may be molded and ground for smoothing purposes. The copper posts 116, 120 are also formed/grown on the redistribution layers 104 and the interconnect bridges 112, 114 when the redistribution layers 104 are grown. The microbumps 118, 122 are then placed on the copper posts 116, 120, respectively, or on the first die 106, the second die 108, and the third die 110. The first die 106, the second die 108, and the third die 110 can then be flip chip attached to the copper posts 116, 120. A mold or encapsulant (not illustrated) can then be placed over the dies 106, 108, 110 and interconnect bridges 112, 114 to substantially encapsulate the components, including the one or more redistribution layers 104.

The carrier 102 is then detached from the packaging arrangements 100, 200. After detachment of the carrier 102, a backside 124 of the one or more redistribution layers 104 can be ground for smoothing purposes. Thus, the bottom of the packaging arrangement 100 will include the backside 124 of the one or more redistribution layers 104 as well as a backside of the interconnect bridges 112, 114 embedded within the redistribution layers 104. Bond pads (not illustrated) defined within the bottom of the redistribution layers 104 and/or the interconnect bridges 112, 114 can then receive copper balls or bumps and the packaging arrangement 100, 200 can be flip chip attached to a substrate (not illustrated).

Thus, in accordance with embodiments, the interconnect bridges 112, 114 allow for high density, e.g., two micrometer or less sizing interconnects and spacing between the dies 106, 108, 110 with only a small amount of silicon used for the interconnect bridges 112, 114. Other interconnects between the first die 106, the second die 108, the third die 110 via the one or more redistribution layers 104, as well as a substrate that receives the packaging arrangement 100, 200, can be provided with the copper posts 120 in a configuration where the density is not as high, for example, the density of the copper posts 120 can be more than two micrometers in size with spacing of more than two micrometers between the copper posts 120.

Figure 3:
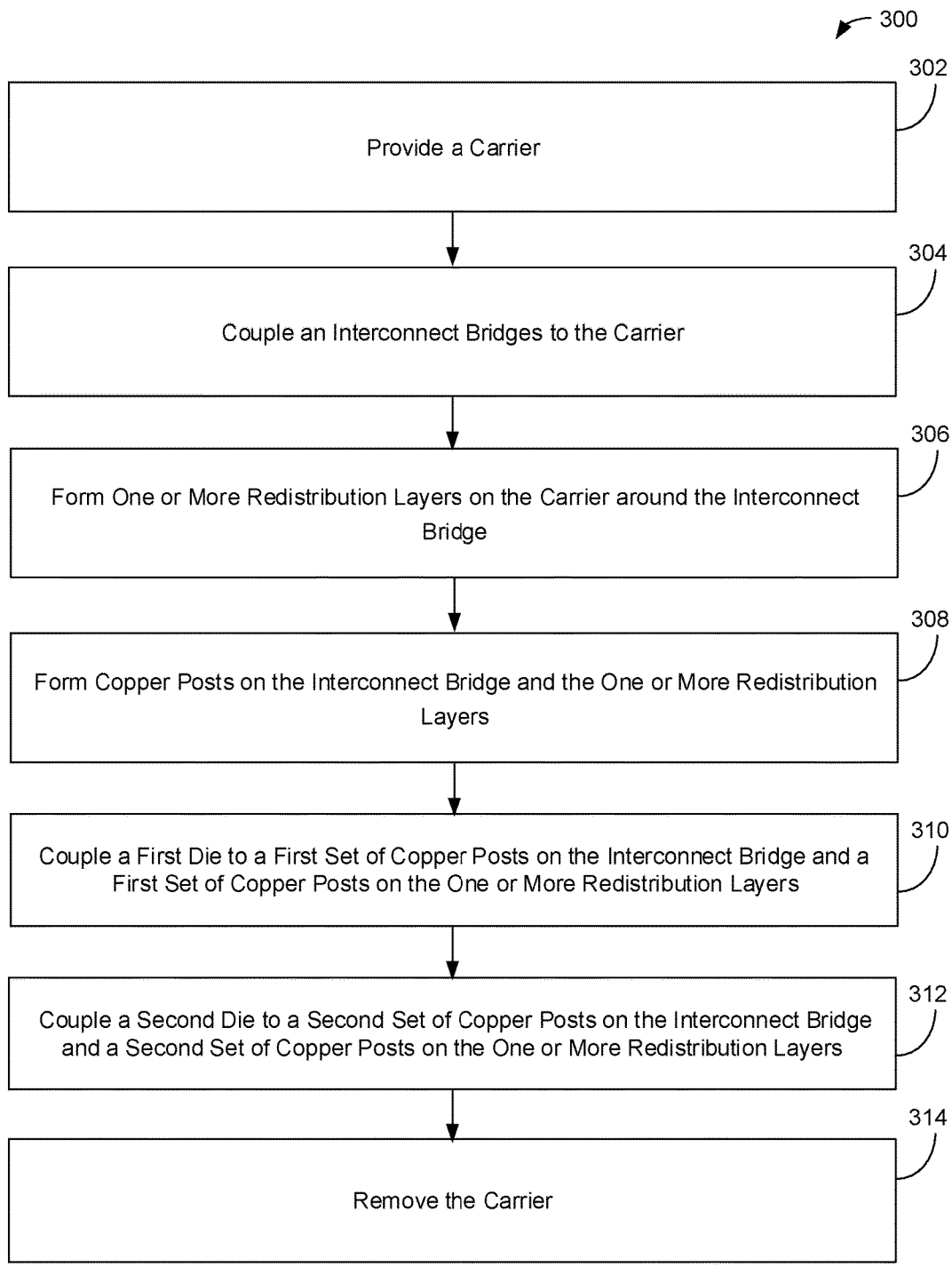
FIG. 3 is a flow diagram of an example method for making a packaging arrangement including high density interconnect bridges, in accordance with embodiments.

FIG. 3 is a flow diagram of an example method 300 for making a packaging arrangement, e.g., packaging arrangements 100 and 200 illustrated in FIGS. 1A, 1B and 2, that includes a high density interconnect bridge for interconnecting dies within the packaging arrangement.

At 302, a carrier, e.g. carrier 102, is provided. At 304, an interconnect bridge, e.g., interconnect bridges 112, 114, is coupled to the carrier. At 306, one or more redistribution layers, e.g., redistribution layer 104, is formed on the carrier around the interconnect bridge. At 308, copper posts, e.g., copper posts 116, 120, are formed on the interconnect bridge and the one or more redistribution layers. At 310, a first die, e.g., die 106, is coupled to a first set of copper posts on the interconnect bridge and a first set of copper posts on the one or more redistribution layers. At 312, a second die, e.g., die 108, is coupled to a second set of copper posts on the interconnect bridge and a second set of copper posts on the one or more redistribution layers. At 314, the carrier is removed.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A packaging arrangement comprising:
   one or more redistribution layers;
   an interconnect bridge embedded within the one or more redistribution layers such that the one or more redistribution layers substantially surround a perimeter of the interconnect bridge, a backside of the interconnect bridge is flush with a backside of the one or more redistribution layers, and a topside of the interconnect bridge remains outside of the one or more redistribution layers;
   a first die coupled to a first portion of the one or more redistribution layers and a first portion of the interconnect bridge; and
   a second die coupled to a second portion of the one or more redistribution layers and a second portion of the interconnect bridge to electrically couple the first die and the second die via at least the first interconnect bridge.

2. The packaging arrangement of claim 1, wherein the interconnect bridge is a first interconnect bridge and the packaging arrangement further comprises:
   a second interconnect bridge embedded within the one or more redistribution layers; and
   a third die coupled to (i) a third portion of the one or more redistribution layers and (ii) a first portion of the second interconnect bridge,
   wherein the first die is coupled to a second portion of the second interconnect bridge to electrically couple the first die and the third die via at least the second interconnect bridge.

3. The packaging arrangement of claim 2, wherein at least one of the first or second interconnect bridges is substantially parallel to an edge of at least one of (i) the first die, (ii) the second die or (iii) the third die.

4. The packaging arrangement of claim 3, wherein both of the first and second interconnect bridges are substantially parallel to an edge of (i) the first die, (ii) the second die or (iii) the third die.

5. The packaging arrangement of claim 3, wherein the first interconnect bridge is substantially parallel to a first edge of the first die and the second interconnect bridge is substantially parallel to a second edge of the first die.

6. The packaging arrangement of claim 1, wherein the interconnect bridge is a first interconnect bridge and the packaging arrangement further comprises:
   a second interconnect bridge embedded within the one or more redistribution layers;
   a third die coupled to (i) a third portion of the one or more redistribution layers and (ii) a first portion of the second interconnect bridge; and
   a fourth die coupled to (i) a fourth portion of the one or more redistribution layers and (ii) a second portion of the second interconnect bridge to electrically couple the third die and the fourth die via at least the second interconnect bridge,
   wherein the first die is coupled to (i) a third portion of the second interconnect bridge to electrically couple the first die and the third die via at least the second interconnect bridge and (ii) a fourth portion of the second interconnect bridge to electrically couple the first die and the fourth die via at least the second interconnect bridge.

7. The packaging arrangement of claim 6, wherein at least one of the first or second interconnect bridges is substantially parallel to an edge of at least one of (i) the first die, (ii) the second die or (iii) the third die.

8. The packaging arrangement of claim 7, wherein both of the first and second interconnect bridges are substantially parallel to an edge of (i) the first die, (ii) the second die or (iii) the third die.

9. The packaging arrangement of claim 7, wherein the first interconnect bridge is substantially parallel to a first edge of the first die and the second interconnect bridge is substantially parallel to a second edge of the first die.

10. The packaging arrangement of claim 7, wherein neither of the first and second interconnect bridges are substantially parallel to an edge of the first die.

11. The packaging arrangement of claim 1, wherein the interconnect bridge is configured such that the first die and the second die are coupled to the interconnect bridge with coupling structures spaced apart by two micrometers or less, wherein the coupling structures have a diameter of two micrometers or less.

12. The packaging arrangement of claim 11, wherein line width and spacing of the coupling structures is less than line width/spacing of the one or more redistribution layers.

13. The packaging arrangement of claim 11, wherein the coupling structures comprise copper posts.

14. The packaging arrangement of claim 13, wherein the copper posts are coupled to the second die via microbumps.

15. The packaging arrangement of claim 1, further comprising a mold substantially encasing the interconnect bridge, the first die and the second die.

16. A method comprising:
   providing a carrier;
   coupling an interconnect bridge to the carrier;
   forming one or more redistribution layers on the carrier around the interconnect bridge such that the one or more redistribution layers substantially surround a perimeter of the interconnect bridge, a backside of the interconnect bridge is flush with a backside of the one or more redistribution layers, and a topside of the interconnect bridge remains outside of the one or more redistribution layers;
   forming copper posts on the interconnect bridge and the one or more redistribution layers;
   coupling a first die to a first set of copper posts on the interconnect bridge and a first set of copper posts on the one or more redistribution layers;
   coupling a second die to a second set of copper posts on the interconnect bridge and a second set of copper posts on the one or more redistribution layers; and
   removing the carrier.

17. The method of claim 16, wherein coupling the first die comprises flip-chip attaching the first die on to the first set of copper posts on the interconnect bridge and the first set of copper posts on the one or more redistribution layers, and wherein coupling the second die comprises flip-chip attaching the second die on to the first set of copper posts on the interconnect bridge and the second set of copper posts on the one or more redistribution layers.

18. The method of claim 16, further comprising placing a mold around the first die, the second die and the interconnect bridge on the one or more redistribution layers.

19. The method of claim 16, wherein the interconnect bridge is a first interconnect bridge and the method further comprises:
   coupling a second interconnect bridge to the carrier;
   forming the one or more redistribution layers on the carrier around the first and second interconnect bridges;
   forming copper posts on the second interconnect bridge and the one or more redistribution layers;
   coupling the first die to a first set of copper posts on the second interconnect bridge and a third set of copper posts on the one or more redistribution layers; and
   coupling a third die to a second set of copper posts on the second interconnect bridge and a fourth set of copper posts on the one or more redistribution layers.

20. The method of claim 16, wherein the interconnect bridge is a first interconnect bridge and the method further comprises:
   coupling a second interconnect bridge to the carrier;
   forming the one or more redistribution layers on the carrier around the first and second interconnect bridges;
   forming copper posts on the second interconnect bridge and the one or more redistribution layers;
   coupling the first die to a first set of copper posts on the second interconnect bridge and a third set of copper posts on the one or more redistribution layers;
   coupling a third die to a second set of copper posts on the second interconnect bridge and a fourth set of copper posts on the one or more redistribution layers; and
   coupling a fourth die to a third set of copper posts on the second interconnect bridge and a fifth set of copper posts on the one or more redistribution layers.

\* \* \* \* \*